(12) United States Patent
Shindo et al.

(10) Patent No.: US 8,310,278 B2
(45) Date of Patent: Nov. 13, 2012

(54) VOLTAGE DETECTION DEVICE

(75) Inventors: Yusuke Shindo, Nagoya (JP); Tsuneo Maebara, Nagoya (JP); Keisuke Hata, Miyoshi (JP)

(73) Assignees: Denso Corporation, Kariya (JP); Toyota Jidosha Kabushika Kaisha, Toyota-shi (JP)

( * ) Notice: Subject to any disclaimer, the term of this patent is extended or adjusted under 35 U.S.C. 154(b) by 123 days.

(21) Appl. No.: 12/977,441

(22) Filed: Dec. 23, 2010

(65) Prior Publication Data

US 2011/0156811 A1 Jun. 30, 2011

(30) Foreign Application Priority Data

Dec. 24, 2009 (JP) ................. 2009-292947

(51) Int. Cl.
*H03F 3/45* (2006.01)
(52) U.S. Cl. .............. 327/63; 327/65; 330/69; 330/129; 330/261

(58) Field of Classification Search ............ 327/50–52, 327/54, 63, 65, 67, 68; 330/69, 129, 130, 330/135, 136, 252, 261, 296, 297
See application file for complete search history.

(56) References Cited

U.S. PATENT DOCUMENTS 5,982,136 A * 11/1999 Pelly ............................ 318/801
7,548,403 B2 * 6/2009 Nagata et al. ................. 361/93.1

FOREIGN PATENT DOCUMENTS

| JP | 2006-87198 | 3/2006 |
| JP | 2010-181351 | 8/2010 |

* cited by examiner

*Primary Examiner* — Patrick O'Neill
(74) *Attorney, Agent, or Firm* — Nixon & Vanderhye P.C.

(57) ABSTRACT

A voltage detection circuit includes operational amplifiers, a battery, and a voltage circuit. The voltage circuit offsets the inverting input terminals and non-inverting input terminals of the operational amplifiers to the positive side with reference to a ground GND.

5 Claims, 4 Drawing Sheets

VOLTAGE DETECTION DEVICE

CROSS-REFERENCE TO RELATED APPLICATION

This application is based on and claims the benefit of priority from earlier Japanese Patent Application No. 2009-292947 filed Dec. 24, 2009, the description of which is incorporated herein by reference.

TECHNICAL FIELD

The present disclosure relates to a voltage detection device that detects voltage.

DESCRIPTION OF THE RELATED ART

Conventionally, a voltage detection device disclosed in Japanese Patent Laid-Open Publication No. 2006-87198, for example, is known as a voltage detection device that detects voltage.

The voltage detection device includes three differential voltage detectors.

One input terminal of a first differential voltage detector is connected to a first bus via a resistor, and the other input terminal is connected to a ground node.

One input terminal of a second differential voltage detector is connected to the ground node, and the other input terminal is connected to a negative bus via a resistor.

One input terminal of a third differential voltage detector is connected to a second bus via a resistor, and the other input terminal is connected to the ground node.

The differential voltage detector can be configured as a differential amplifier circuit using an operational amplifier. In the third differential voltage detector, one input terminal of the operation amplifier is connected to the ground node and the other input terminal is connected to the negative bus.

With reference to the ground node, a negative voltage is applied to the other input terminal of the operational amplifier. Therefore, unless a positive voltage with reference to the ground node is supplied to a power supply terminal (hereafter called "positive power supply terminal") of the operation amplifier and a negative voltage with reference to the ground node is supplied to a power supply terminal (hereafter called "negative power supply terminal"), the potential difference between the input terminals cannot be normally amplified.

In other words, a negative power supply that supplies the negative voltage is required in addition to a positive power supply that supplies the positive voltage. However, adding the negative power supply to the operation amplifier compared to only having the positive power supply is problematic because the device cost increases.

SUMMARY

An embodiment provides a voltage detection device that does not require a negative power supply for operating an operational amplifier and is capable of reducing cost.

In a voltage detection device according to a first aspect, the voltage detection device includes an operational amplifier that operates by a positive power supply terminal and a negative power supply terminal being supplied a voltage with reference to a first ground, the operational amplifier amplifying a potential difference between two input terminals connected to an electronic circuit that operates with reference to a second ground insulated from the first ground and outputting the amplified potential difference, wherein, a voltage circuit that applies a positive voltage with reference to the first ground to the two input terminals.

The negative power supply terminal of the operational amplifier is connected to the first ground, and the positive power supply terminal is supplied a positive voltage with reference to the first ground.

Here, the first and second grounds are named for convenience to differentiate between the grounds. Further, a positive power supply terminal is a terminal that a positive voltage with reference to the first ground is supplied to the operational amplifier while a negative power supply terminal is a terminal that a negative voltage with reference to the first ground is supplied to the operational amplifier.

In the configuration, the two input terminals of the operational amplifiers are offset to the positive side with reference to the first ground. Therefore, the voltages of the input terminals do not become negative voltages with reference to the first ground, even when the voltages inputted to the input terminals are negative voltages with reference to the first ground.

Therefore, the potential difference between the input terminals can be normally amplified by the negative power supply terminal of the operational amplifier being connected to the first ground and the positive power supply terminal being supplied a positive voltage with reference to the first ground.

In other words, the operational amplifier can be operated using only a positive power supply that supplies a positive voltage with reference to the first ground.

As a result, a negative power supply for operating the operational amplifier is no longer required, and cost can be reduced.

In the voltage detection device according to a second aspect, the voltage of the voltage circuit are set such that the voltages of the input terminals of the operational amplifier do not become negative voltages with reference to the first ground, even when the voltages inputted to the input terminals change.

In the voltage detection device according to a third aspect, the voltage circuit is a power supply that supplies the positive voltage with reference to the first ground to a control circuit that operates with reference to the first ground and controls the voltage circuit.

In the voltage detection device according to a fourth aspect, the operational amplifier amplifies the potential difference between the two input terminals by a predetermined factor.

The positive voltage with reference to the first ground supplied to the positive power supply terminal of the operational amplifier is set higher than the sum of the potential difference between the two input terminals by the predetermined factor and the positive voltage with reference to the first ground supplied to the two input terminals.

In the voltage detection device according to a fifth aspect, a potential difference between predetermined parts of the electronic circuit installed in a vehicle is amplified and outputted.

DETAILED DESCRIPTION OF THE PREFERRED EMBODIMENTS

With reference to the drawings, hereinafter will be described embodiments of the present disclosure. In the embodiments, an example is given in which a voltage detection device of the present disclosure is applied to a motor-generator control device mounted on a vehicle.

First Embodiment

Figure 1:
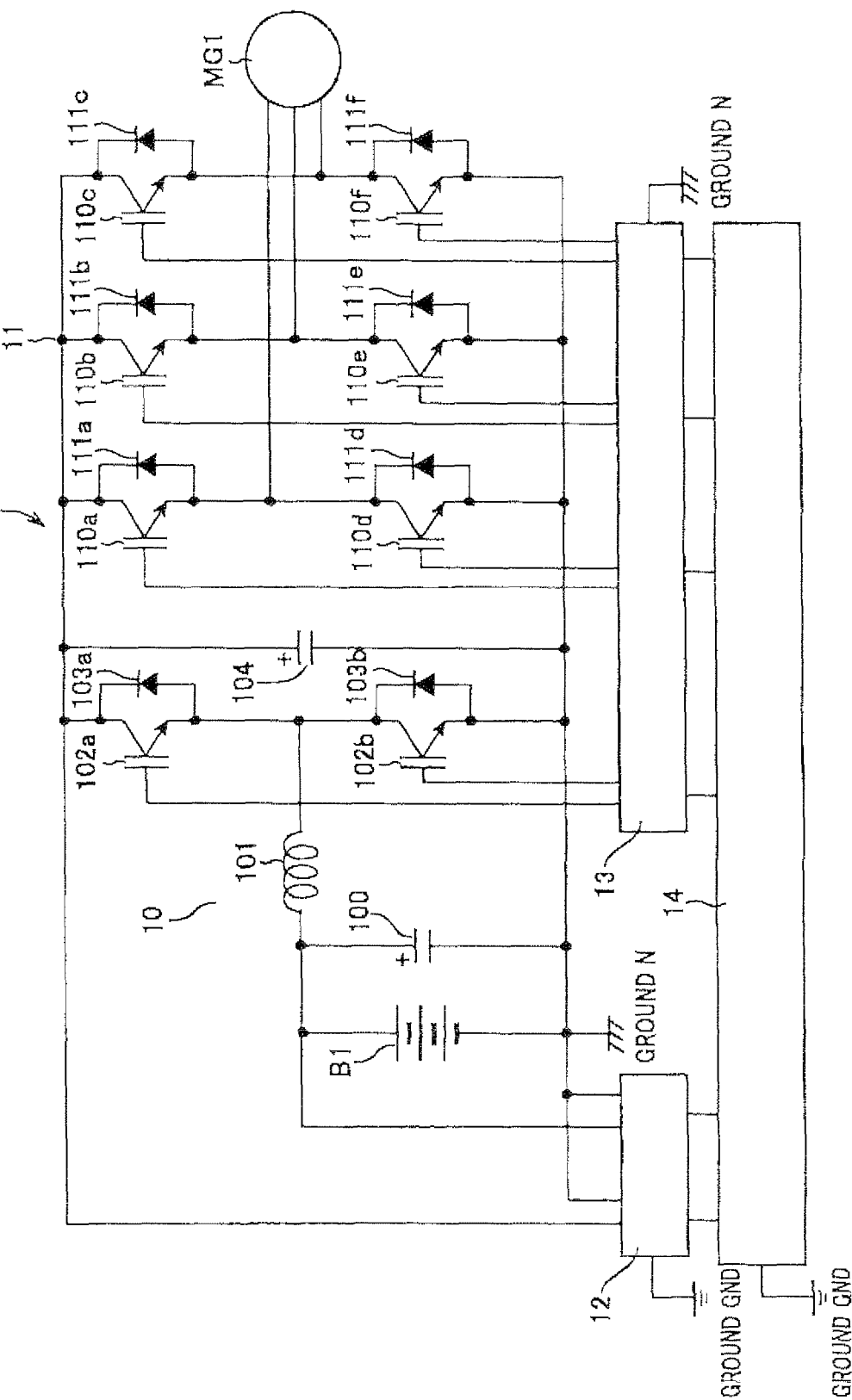
FIG. 1 is a circuit diagram of a motor-generator control device according to a first embodiment.
Figure 2:
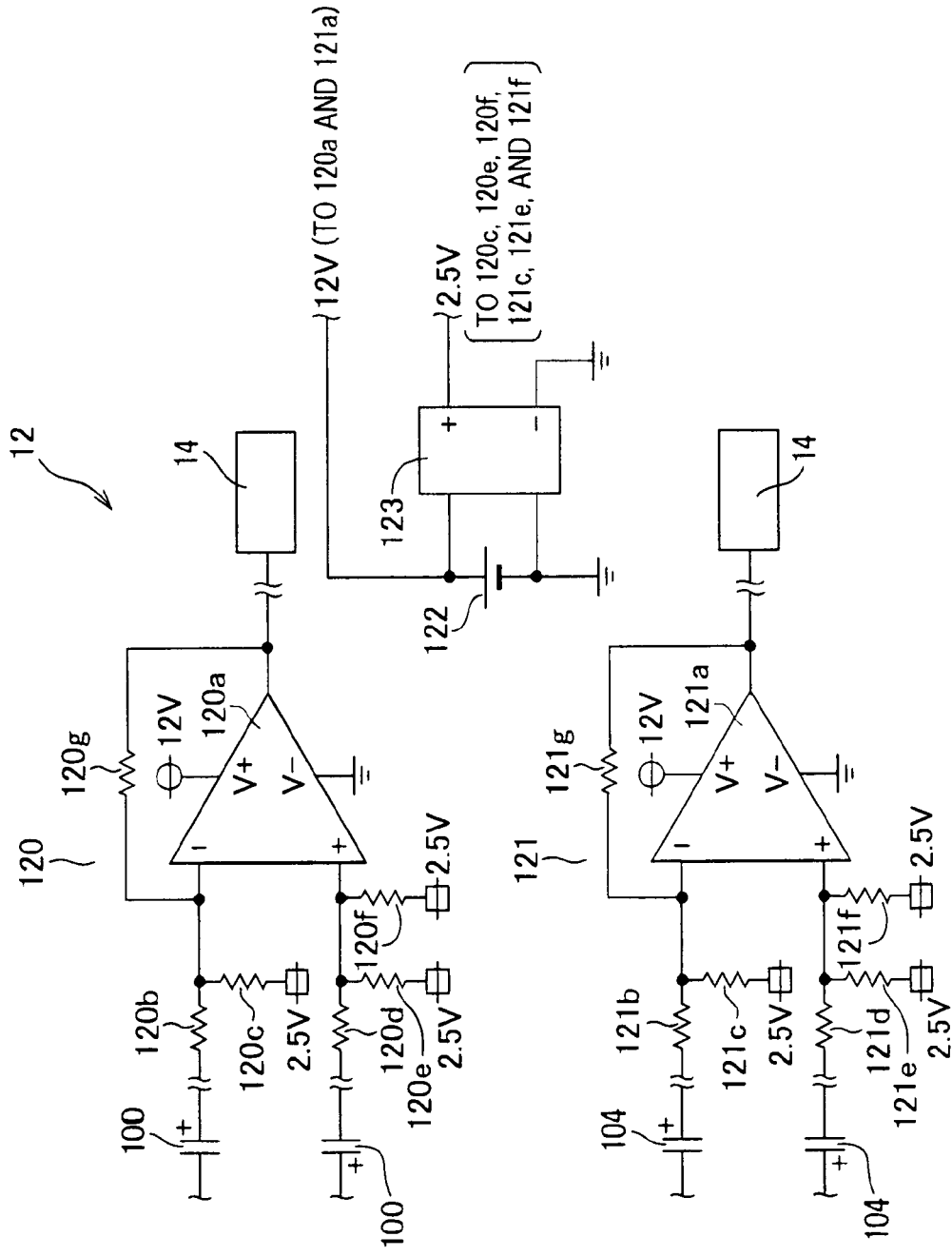
FIG. 2 is a circuit diagram of a voltage detection circuit in FIG. 1.

First, a configuration of a motor-generator control device will be described with reference to FIG. 1. FIG. 1 is a circuit diagram of the motor-generator control device according to a first embodiment. FIG. 2 is a circuit diagram of a voltage detection circuit in FIG. 1.

A motor-generator MG1 shown in FIG. 1 is an apparatus that operates as a motor when supplied a three-phase alternating current (AC) voltage and operates as a generator that generates a three-phase AC voltage when supplied an external driving force.

A motor-generator control device 1 is configured by a converter circuit 10 (electronic circuit), an inverter circuit 11, a voltage detection circuit 12 (voltage detection device), a drive circuit 13, and a control circuit 14.

The converter circuit 10 is a circuit that operates with reference to a ground N (a second ground). The converter circuit 10 boosts a direct current (DC) voltage outputted from a battery B1 and supplies the boosted DC voltage to the inverter circuit 11.

Conversely, the converter circuit 10 also bucks (steps down) a DC voltage outputted from the inverter circuit 11 and charges the battery B1. The converter circuit 10 is configured by a low-voltage-side capacitor 100, a coil 101, insulated-gate bipolar transistors (IGBT) 102a and 102b, flywheel diodes 103a and 103b, and a high-voltage-side capacitor 104.

The low-voltage-side capacitor 100 is a component used to smooth the DC voltage on the low-voltage side. The low-voltage-side capacitor 100 smoothes the DC voltage outputted from the battery B1 during a boost operation and smoothes the bucked DC voltage that charges the battery B1 during a buck operation.

The positive terminal and the negative terminal of the low-voltage-side capacitor 100 are respectively connected to the positive terminal and the negative terminal of the battery B1. Here, the negative terminal of the battery B1 is connected to the ground N serving as the reference point for voltage.

The coil 101 is a component that stores and discharges energy, and induces voltage as a result of current flowing through the coil 101. One end of the coil 101 is connected to the positive terminal of the low-voltage-side capacitor 100, and the other end is connected to the IGBT 102a and 102b.

The IGBT 102a and 102b are switching elements that are turned ON and OFF to store energy in the coil 101 and to discharge energy from the coil 101. The IGBT 102a and 102b are serially connected.

Specifically, the emitter of the IGBT 102a is connected to the collector of the IGBT 102b. The serial connection point of the serially connected IGBT 102a and 102b is connected to the other end of the coil 101.

Furthermore, the collector of the IGBT 102a is connected to the positive terminal of the high-voltage-side capacitor 104, and the emitter of the IGBT 102b is connected to the negative terminals of the low-voltage-side capacitor 100 and the high-voltage-side capacitor 104.

Moreover, the gates of the IGBT 102a and the 102b are each connected to the drive circuit 13.

The flywheel diodes 103a and 103b are components used to send a flywheel current that is generated when the IGBT 102a or 102b is turned OFF and the energy stored in the coil 101 is discharged.

The anodes of the flywheel diodes 103a and 103b are respectively connected to the emitters of the IGBT 102a and 102b, and the cathodes are respectively connected to the collectors of the IGBT 102a and 102b.

The high-voltage-side capacitor 104 is a component used to smooth the DC voltage on the high-voltage side. The high-voltage-side capacitor 104 smoothes the boosted DC voltage supplied to the inverter circuit 11 during a boost operation and smoothes the DC voltage outputted from the inverter circuit 11 during a buck operation.

The positive terminal of the high-voltage-side capacitor 104 is connected to the collector of the IGBT 102a, and the negative terminal is connected to the emitter of the IGBT 102b.

The positive terminal and the negative terminal of the high-voltage-side capacitor 104 are also each connected to the inverter circuit 11.

The inverter circuit 11 is a circuit that operates with reference to the ground N (the second ground). When the motor-generator MG1 is operating as a motor, the inverter circuit 11 converts a high DC voltage outputted from the converter circuit 10 to a three-phase AC voltage and supplies the three-phase AC voltage to the motor-generator MG1.

Conversely, when the motor-generator MG1 is operating as a generator, the inverter circuit 11 is a device that converts a three-phase AC voltage generated by the motor-generator MG1 to a DC voltage and supplies the DC voltage to the converter circuit 10. The inverter circuit 11 is configured by IGBT 110a to 110f and flywheel diodes 111a to 111f.

The IGBT 110a to 110f are switching elements that are turned ON and OFF to convert a DC voltage to a three-phase AC voltage. The IGBT 110a and 110d, the IGBT 110b and 110e, and the IGBT 110c and 110f are each serially connected.

Specifically, the emitters of the IGBT 110a to 110c are respectively connected to the collectors of the IGBT 110d to 110f. The three pairs of serially connected IGBT, namely the IGBT 110a and 110d, the IGBT 110b and IGBT 110e, and the IGBT 110c and 110f, are connected in parallel.

The collectors of the IGBT 110a to 110c are each connected to the positive terminal of the high-voltage-side capacitor 104, and the emitters of the IGBT 110d to 110f are each connected to the negative terminal of the high-voltage-side capacitor 104.

The gates of the IGBT 110a to 110f are each connected to the drive circuit 13. The serial connection points of the serially connected the IGBT 110a and 110d, the IGBT 110b and 110e, and the IGBT 110c and 110f are each connected to the motor-generator MG1.

The flywheel diodes 111a to 111f are components used to send a flywheel current generated when their respective IGBT is OFF and the energy stored in the coil 101 of the motor-generator MG1 is discharged.

In addition, the flywheel diodes 111a to 111f are components used to convert the three-phase AC voltage generated by the motor-generator MG1 to a DC voltage.

The anodes of the flywheel diodes 111a to 111f are respectively connected to the emitters of the IGBT 110a to 110f, and the cathodes are respectively connected to the collectors of the IGBT 110a to 110f.

As shown in FIG. 2, the voltage detection circuit 12 is a circuit that detects the voltage of a predetermined section of the converter circuit 10.

Specifically, the voltage detection circuit 12 is a circuit that operates with reference to a ground GND (a first ground) that is insulated from the ground N, and detects voltages on the low-voltage side and the high-voltage side of the converter circuit 10.

More specifically, the voltage detection circuit 12 amplifies the voltages between the terminals of the low-voltage-side capacitor 100 and the high-voltage-side capacitor 104 and outputs the amplified voltages.

The voltage detection circuit 12 includes a low-voltage-side voltage detection circuit 120, a high-voltage-side voltage detection circuit 121, a battery 122, and a voltage circuit 123.

The low-voltage-side voltage detection circuit 120 is a circuit that detects the voltage on the low-voltage-side of the converter circuit 10.

Specifically, the low-voltage-side voltage detection circuit 120 detects the voltage between the terminals of the low-voltage-side capacitor 100.

The low-voltage-side voltage detection circuit 120 includes an operational amplifier 120a and resistors 120b to 120g.

The operational amplifier 120a is a component that operates by being supplied a voltage with reference to the ground GND between a power supply terminal (hereafter called "positive power supply terminal") V+ and a power supply terminal (hereafter called "negative power supply terminal") V−.

The operational amplifier 120a amplifies the potential difference between two input terminals, an inverting input terminal and a non-inverting input terminal, and outputs the amplified potential difference.

Specifically, the operational amplifier 120a is a component that amplifies the potential difference between the inverting input terminal and the non-inverting input terminal connected to the converter circuit 10 via the resistors 120b and 120c and the resistors 121b and 121c, and outputs the amplified potential difference.

The resistors 120b and 120c are components used to divide the voltage of the positive terminal of the low-voltage-side capacitor 100, and are serially connected.

One end of the resistor 120b is connected to the positive terminal of the low-voltage-side capacitor 100. One end of the resistor 120c is connected to the voltage circuit 123.

The serial connection point between the resistors 120b and 120c is connected to the inverting input terminal of the operational amplifier 120a.

The resistors 120d and 120e are components used to divide the voltage of the negative terminal of the low-voltage-side capacitor 100, and are serially connected.

One end of the resistor 120d is connected to the negative terminal of the low-voltage-side capacitor 100. One end of the resistor 120e is connected to the voltage circuit 123.

The serial connection point between the resistors 120d and 120e is connected to the non-inverting input terminal of the operational amplifier 120a.

The resistors 120f and 120g are components used to determine an amplifying gain of the operational amplifier 120a. One end of the resistor 120f is connected to the voltage circuit 123, and the other end is connected to the non-inverting input terminal of the operational amplifier 120a.

One end of the resistor 120g is connected to the inverting input terminal of the operational amplifier 120a, and the other end is connected to the output terminal of the operational amplifier 120a.

The output terminal of the operational amplifier 120a is connected to the control circuit 14. The negative power supply terminal V− is connected to the ground GND.

Specifically, the negative power supply terminal V− is connected to the vehicle body. Furthermore, the positive power supply terminal V+ is connected to the battery 122.

The high-voltage-side voltage detection circuit 121 is a circuit that detects the voltage on the high-voltage-side of the converter circuit 10.

Specifically, the high-voltage-side voltage detection circuit 121 amplifies the voltage between the terminals of the high-voltage-side capacitor 104 and outputs the amplified voltage.

The high-voltage-side voltage detection circuit 121 includes an operational amplifier 121a and resistors 121b to 121g. The high-voltage-side voltage detection circuit 121 has the same configuration as the low-voltage-side voltage detection circuit 120.

The battery 122 is a power supply that supplies a positive voltage with reference to the ground GND for operating the operational amplifiers 120a and 121a.

The battery 122 outputs a DC voltage of 12V. The negative terminal of the battery 122 is connected to the ground GND.

Specifically, the negative terminal is connected to the vehicle body. In other words, the negative terminal is connected to the negative power supply terminals V− of the operational amplifiers 120a and 121a via the ground GND.

The positive terminal of the battery 122 is connected to the positive power supply terminals V+ of the operational amplifiers 120a and 121a. As a result, the positive voltage of 12V with reference to the ground GND is supplied to the positive terminals of the operational amplifiers 120a and 121a.

The voltage circuit 123 is a circuit that applies a positive voltage with reference to the ground GND to the inverting input terminals and the non-inverting input terminals of the operational amplifiers 120a and 121a.

The voltage circuit 123 converts the voltage of the battery 122 to a lower DC voltage of 2.5V and outputs the 2.5V DC voltage.

The two input terminals of the voltage circuit 123 are respectively connected to the positive terminal and the negative terminal of the battery 122. In addition, the negative terminal is connected to the ground GND.

Specifically, the negative terminal is connected to the vehicle body. Furthermore, the positive terminal is connected to one end of each resistor 120c, 120e, 120f, 121c, 121e, and 121f.

As a result, the positive voltage of 2.5V with reference to the ground GND is applied to the inverting input terminals and the non-inverting input terminals of the operational amplifiers 120a and 121a, via the resistors 120c, 120e, 120f, 121c, 121e, and 121f.

Here, the resistance values of the resistors 120b to 120e and 121b to 121e that divide the terminal voltages of the low-voltage-side capacitor 100 and the high-voltage-side capacitor 104, and the voltage of the voltage circuit 123 are set such that the voltages of the inverting input terminals and the non-inverting input terminals of the operational amplifiers 120a and 121a do not become negative voltages with reference to the ground GND, even when the voltages inputted to the inverting input terminals and the non-inverting input terminals change.

In addition, the voltage of the battery 122, the resistance values of the resistors 120f, 120g, 121f, and 121g, and the voltage of the voltage circuit 123 are set such that the voltage of the battery 122 is higher than the sum of the respective potential differences between the inverting input terminals and the non-inverting input terminals of the operational amplifiers 120a and 121a multiplied by the amplifying gain (a predetermined factor), and the voltage of the voltage circuit 123.

The drive circuit 13 is a circuit that operates with reference to the ground N, and drives the IGBT 102a, 102b, and 110a to 110f based on drive signals from the control circuit 14.

The drive circuit 13 is connected to the gate of each IGBT 102a, 102b, and 110a to 110f. The drive circuit 13 is also connected to the control circuit 14.

The control circuit 14 is a circuit that operates with reference to the ground GND. When the motor-generator MG1 is operating as a motor, the control circuit 14 turns ON and OFF the IGBT 102b such that the converter circuit 10 performs a boost operation based on the detection result from the voltage detection circuit 12, and turns ON and OFF the IGBT 110a to 110f such that the inverter circuit 11 converts the DC voltage to a three-phase AC voltage.

Conversely, when the motor-generator MG1 is operating as a generator, the control circuit 14 turns ON and OFF the IGBT 102a such that the converter circuit 10 performs a buck operation based on the detection result from the voltage detection circuit 12.

The control circuit 14 is connected to the voltage detection circuit 12. In addition, the control circuit 14 is connected to the drive circuit 13 via a photo-coupler (not shown) provided within.

Next, operations of the motor-generator control device will be described with reference to FIG. 1.

In FIG. 1, when the motor-generator MG1 is operating as a motor, the control circuit 14 turns ON the IGBT 102b based on the detection result from the voltage detection circuit 12 and stores energy from the battery 1 in the coil 101.

The control circuit 14 then turns OFF the IGBT 102b and discharges the energy stored in the coil 101. At this time, the other end of the coil 101 connected to the IGBT 102a and 102b has a higher potential than the one end connected to the low-voltage-side capacitor 100.

In other words, the voltage of the other end of the coil 101 is higher than the voltage of the battery B1. Because both IGBT 102a and 102b are turned OFF, the current accompanying the discharge of energy from the coil 101 flows to the high-voltage-side capacitor 104 via the flywheel diode 103a, and the high-voltage-side capacitor 104 is charged.

Subsequently, a similar operation is repeatedly performed, and the voltage of the high-voltage-side capacitor 104 is held at a predetermined voltage.

Furthermore, the control circuit 14 turns ON and OFF the IGBT 110a to 110f at predetermined timings based on the detection results from the voltage detection circuit 12, converts the DC voltage charged in the high-voltage-side capacitor 104 to a three-phase AC voltage, and supplies the three-phase AC voltage to the motor-generator MG1.

When the three-phase AC voltage is supplied from the inverter circuit 11, the motor-generator MG1 operates as a motor and generates torque.

On the other hand, when the motor-generator MG1 operates as a generator, the inverter circuit 11 converts the three-phase AC voltage generated by the motor-generator MG1 to a DC voltage by a rectification circuit configured by the flywheel diodes 110a to 110f.

The high-voltage-side capacitor 104 is then charged by the converted DC voltage.

The control circuit 14 turns ON the IGBT 102a based on the detection result from the voltage detection circuit 12 and stores energy from the high-voltage-side capacitor 104 in the coil 101.

The control circuit 14 then turns OFF the IGBT 102a and discharges the energy stored in the coil 101. At this time, the one end of the coil 101 connected to the low-voltage-side capacitor 102 has a higher potential than the other end connected to the IGBT 102a and 102b.

In other words, the voltage of the one end of the coil 101 is lower than the voltage of the high-voltage-side capacitor 104. Because both IGBT 102a and 102b are turned OFF, the current accompanying the discharge of energy from the coil 101 flows to the battery B1 via the flywheel diode 103b, and the battery B1 is charged.

Subsequently, a similar operation is repeatedly performed, and the voltage of the battery B1 is held at a predetermined voltage.

Next, operations of the voltage detection circuit will be described with reference to FIG. 1 to FIG. 3. Here, FIG. 3 is a voltage waveform diagram of input voltages of the voltage detection circuit and the operational amplifiers.

When the IGBT 102a and 102b shown in FIG. 1 are switched between ON and OFF, the voltages with reference to the ground GND of the positive terminals and negative terminals of the low-voltage-side capacitor 100 and the high-voltage-side capacitor 104 change periodically.

Figure 3:
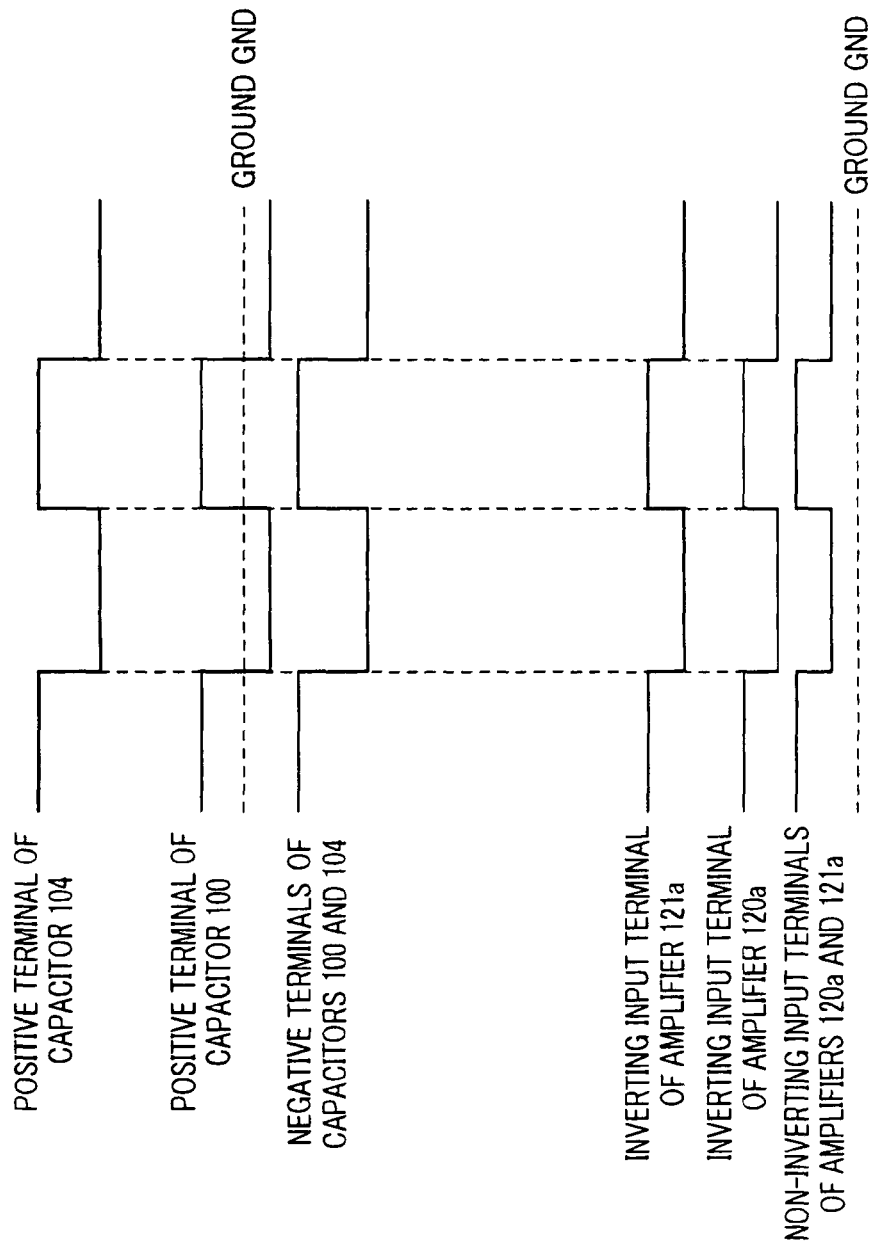
FIG. 3 is a voltage waveform diagram of input voltages of the voltage detection circuit and operational amplifiers.

As shown in FIG. 3, the voltage of the positive terminal of the high-voltage-side capacitor 104 becomes a positive voltage with reference to the ground GND.

The voltage of the positive terminal of the low-voltage-side capacitor 100 changes periodically between positive and negative with reference to the ground GND. The voltages of the negative terminals of the low-voltage-side capacitor 100 and the high-voltage-side capacitor 104 become negative voltages with reference to the ground GND.

As shown in FIG. 2, the voltages are divided by the resistors 120b to 120e and 121b to 121e, and inputted to the operational amplifiers 120a and 121a.

The one end of each resistor 120c, 120e, 121c, and 121e is connected to the voltage circuit 123, and a positive voltage with reference to the ground GND is applied thereto. Here, the resistance values of the resistors 120b to 120e and 121b to 121e, and the voltage of the voltage circuit 123 are set such that the voltages of the inverting input terminals and the non-inverting input terminals of the operational amplifiers 120a and 121a do not become negative voltages with reference to the ground GND, even when the voltages inputted to the inverting input terminals and the non-inverting input terminals change or, in other words, the voltages of the positive terminals and negative terminals of the low-voltage-side capacitor 100 and the high-voltage-side capacitor 104 change.

Therefore, as shown in FIG. 3, the voltages of the inverting input terminals and the non-inverting input terminals of the operational amplifiers 120a and 121a become positive voltages with reference to the ground GND.

Thus, as shown in FIG. 2, the potential difference between the input terminals can be normally amplified, as a result of the negative power supply terminals V− of the operational amplifiers 120a and 121a being connected to the ground GND, and the positive power supply terminals V+ being supplied a positive voltage with reference to the ground GND.

Next, effects of the above will be described. According to the first embodiment, the inverting input terminals and the non-inverting input terminals of the operational amplifiers 120a and 121a are offset to the positive side with reference to the ground GND.

Therefore, the voltages of the input terminals do not become negative voltages with reference to the ground GND, even when the voltages inputted to the input terminals are negative voltages with reference to the ground GND.

Therefore, as a result of the negative power supply terminals V− of the operational amplifiers 120a and 121a being connected to the ground GND and the positive power supply terminals V+ being supplied a positive voltage with reference to the ground GND, the potential difference between the input terminals can be normally amplified.

In other words, the operational amplifiers 120a and 121a can be operated using only the battery 122 that supplies a positive voltage with reference to the ground GND. The operational amplifiers 120a and 121a can be operated using only positive power supply.

As a result, in a voltage detection device that amplifies the voltages between the terminals of the low-voltage-side capacitor 100 and the high-voltage-side capacitor 104 of the converter circuit 10 mounted on a vehicle and outputs the amplified voltages, a negative power supply for operating the operational amplifiers 120a and 121a is no longer required, and cost can be reduced.

In addition, according to the first embodiment, the resistance values of the resistors 120b to 120e and 121b to 121e that divide the terminal voltages of the low-voltage-side capacitor 100 and the high-voltage-side capacitor 104, and the voltage of the voltage circuit 123 are set such that the voltages of the inverting input terminals and the non-inverting input terminals of the operational amplifiers 120a and 121a do not become negative voltages with reference to the ground GND, even when the voltages inputted to the inverting input terminals and the non-inverting input terminals change.

Therefore, the operational amplifiers 120a and 121a can be operated with certainty using only the positive power supply.

Furthermore, according to the first embodiment, the voltage of the battery 122, the resistance values of the resistors 120f, 120g, 121f, and 121g, and the voltage of the voltage circuit 123 are set such that the voltage of the battery 122 is higher than a voltage that is the sum of the respective potential differences between the inverting input terminals and the non-inverting input terminals of the operational amplifiers 120a and 121a, the respective potential differences between the inverting input terminals and the non-inverting input terminals of the operational amplifiers 120a and 121a multiplied by the amplifying gain, and the voltage of the voltage circuit 123.

Therefore, the respective potential differences between the inverting input terminals and the non-inverting input terminals of the operational amplifiers 120a and 121a can be amplified with certainty by the amplifying gain and outputted without saturation.

According to the first embodiment, an example is given in which the voltage circuit 123 is separately provided as the circuit that applies the positive voltage with reference to the ground GND to the inverting input terminals and the non-inverting input terminals of the operational amplifiers 120a and 121a.

However, this is not limited thereto. If a circuit that outputs a suitable voltage is present within the motor-generator control device 1, the circuit can be used to apply the positive voltage with reference to the ground GND. As a result, the configuration can be simplified.

Second Embodiment

Next, a second embodiment of the motor-generator control device will be described. A motor-generator control device according to the second embodiment is the motor-generator control device according to the first embodiment in which the values of the voltage supplied to operate the operational amplifier configuring the voltage detection circuit and the voltage applied to the inverting input terminal and the non-inverting input terminal of the operational amplifier are changed.

A configuration of a voltage detection circuit will be described with reference to FIG. 4.

Figure 4:
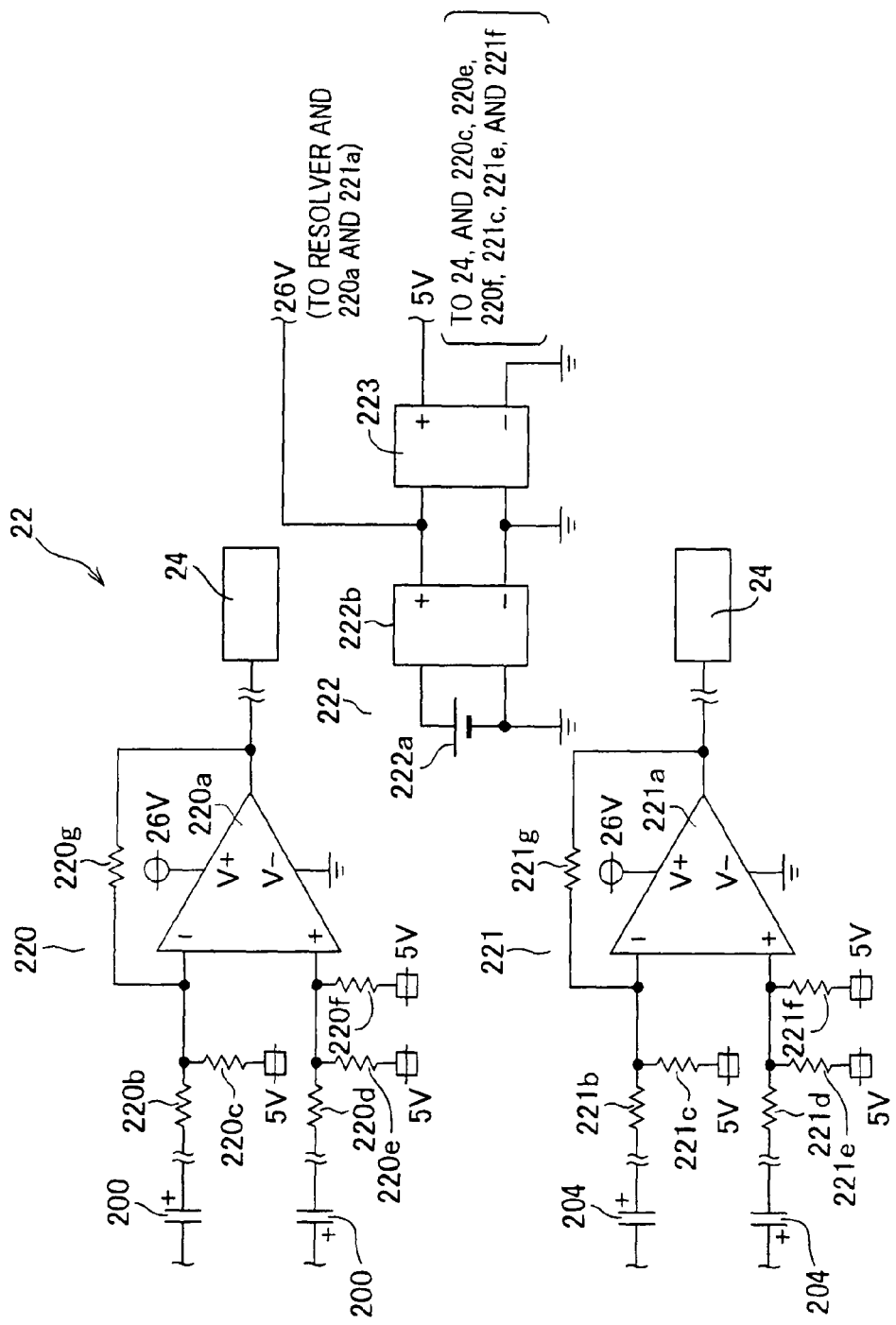
FIG. 4 is a circuit diagram of a voltage detection circuit according to a second embodiment.

Here, FIG. 4 is a circuit diagram of the voltage detection circuit according to the second embodiment. Here, the voltage detection circuit that is a section differing from that in the motor-generator control device according to the first embodiment will be described. Descriptions of shared sections will be omitted, aside from those that require description.

As shown in FIG. 4, a voltage detection circuit 22 includes a low-voltage-side voltage detection circuit 220, a high-voltage-side voltage detection circuit 221, a power supply circuit 222, and a power supply circuit 223 (voltage circuit and power supply).

The low-voltage-side voltage detection circuit 220 includes an operational amplifier 220a and resistors 220b to 220g. The high-voltage-side voltage detection circuit 221 includes an operational amplifier 221a and resistors 221b to 221g.

The low-voltage-side voltage detection circuit 220 and the high-voltage-side voltage detection circuit 221 have the same configurations as the low-voltage-side voltage detection circuit 120 and the high-voltage-side voltage detection circuit 121 according to the first embodiment and are respectively connected to the low-voltage-side capacitor 200, the high-voltage-side capacitor 204, and the control circuit 24 as in the first embodiment.

The power supply circuit 222 is a circuit that supplies a positive voltage with reference to the ground GND for operating a resolver that detects a rotation angle, provided in the motor generator.

The power supply circuit 222 also supplies a positive voltage with reference to the ground GND for operating the operational amplifiers 220a and 221a. The power supply circuit 222 outputs a DC voltage of 26V, and includes a battery 222a and a boost circuit 222b.

The battery 222a is a power supply that outputs a DC voltage of 12V. The positive terminal and negative terminal of the battery 222a are connected to the boost circuit 222b.

In addition, the negative terminal is connected to the ground GND. Specifically, the negative terminal is connected to the vehicle body.

The boost circuit 222b is a circuit that boosts the output voltage of the battery 222a to a DC voltage of 26V and outputs the 26V DC voltage.

The two input terminals of the boost circuit 222b are respectively connected to the positive terminal and the negative terminal of the battery 222a.

In addition, the negative terminal is connected to the ground GND.

Specifically, the negative terminal is connected to the vehicle body. In other words, the negative terminal is connected to the negative power supply terminals V− of the operational amplifiers 220a and 221a, via the ground GND.

Furthermore, the positive terminal is connected to the positive power supply terminals V+ of the operational amplifiers 220a and 221a.

As a result, the positive voltage of 26V with reference to the ground GND is supplied to the positive terminals of the operational amplifiers 220a and 221a.

The power supply circuit 223 is a circuit that supplies a positive voltage with reference to the ground GND for operating a control circuit.

The power supply circuit 223 also applies a positive voltage with reference to the ground GND to the inverting input terminals and the non-inverting input terminals of the operational amplifiers 220a and 221a.

The power supply circuit 223 converts the voltage of the power circuit 222 to a lower DC voltage of 5V, and outputs the 5V DC voltage. The two input terminals of the power supply circuit 223 are respectively connected to the positive terminal and the negative terminal of the power supply circuit 222.

In addition, the negative terminal is connected to the ground GND. Specifically, the negative terminal is connected to the vehicle body.

Furthermore, the positive terminal is connected to the one end of each resistor 220c, 220e, 220f, 221c, 221e, and 221f. As a result, the positive voltage of 5V with reference to the ground GND is applied to the inverting input terminals and the non-inverting input terminals of the operational amplifiers 220a and 221a via the resistors 220c, 220e, 220f, 221c, 221e, and 221f.

Here, the resistance values of the resistors 220b to 220e and 221b to 221e that divide the terminal voltages of the low-voltage-side capacitor and the high-voltage-side capacitor, and the voltage of the power supply circuit 223 are set such that the voltages of the inverting input terminals and the non-inverting input terminals of the operation amplifiers 220a and 221a do not become negative voltages with reference to the ground GND, even when the voltages inputted to the inverting input terminals and the non-inverting input terminals change.

Operations are the same as those of the voltage detection circuit 12 according to the first embodiment. Therefore, descriptions thereof will be omitted.

Next, effects of the above will be described. According to the second embodiment, the power supply circuit 223 that supplies the voltage for operating the control circuit is used as the circuit that applies the positive voltage with reference to the ground GND to the inverting input terminals and the non-inverting input terminals of the operation amplifiers 220a and 221a.

In addition, the power supply circuit 222 that supplies the voltage for operating the resolver is used as the circuit that supplies the positive voltage with reference to the ground GND for operating the operation amplifiers 220a and 221a. Therefore, the configuration can be simplified, thereby further reducing cost.

According to the first and second embodiments, an example is given in which the voltage detection circuit has two operational amplifiers. However, the voltage detection circuit is not limited thereto. The voltage detection circuit may have one operational amplifier, or three or more operational amplifiers.

What is claimed is:

1. A voltage detection device comprising:
   an operational amplifier that operates by a positive power supply terminal and a negative power supply terminal being supplied a voltage with reference to a first ground, the operational amplifier amplifying a potential difference between two input terminals connected to an electronic circuit that operates with reference to a second ground insulated from the first ground and outputting the amplified potential difference, wherein,
   a voltage circuit that applies a first positive voltage with reference to the first ground to the two input terminals,
   the negative power supply terminal of the operational amplifier is connected to the first ground, and
   the positive power supply terminal is supplied a second positive voltage with reference to the first ground.

2. The voltage detection device according to claim 1, wherein
   the first positive voltage with reference to the first ground applied by the voltage circuit is set such that the voltages of the input terminals of the operational amplifier do not become negative voltages with reference to the first ground, even when the voltages of the input terminals of the operational amplifier change.

3. The voltage detection device according to claim 1, wherein
   the voltage circuit applies the first positive voltage with reference to the first ground to a control circuit that operates with reference to the first ground.

4. The voltage detection device according to claim 1, wherein
   the operational amplifier amplifies the potential difference between the two input terminals by a predetermined factor, and
   the second positive voltage with reference to the first ground supplied to the positive power supply terminal of the operational amplifier is set higher than the sum of the potential difference between the two input terminals by the predetermined factor and the first positive voltage with reference to the first ground supplied to the two input terminals.

5. The voltage detection device according to claim 1, wherein
   the potential difference between the two input terminals is amplified and outputted and represents a potential difference between parts of the electronic circuit installed in a vehicle.

* * * * *